United States Patent
Brannon et al.

(10) Patent No.: US 7,915,169 B2
(45) Date of Patent: Mar. 29, 2011

(54) PROCESSES FOR FORMING ELECTRONIC DEVICES INCLUDING POLISHING METAL-CONTAINING LAYERS

(75) Inventors: Christopher E. Brannon, Pflugerville, TX (US); Michael Wedlake, Austin, TX (US); Chris A. Nauert, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 203 days.

(21) Appl. No.: 11/934,628

(22) Filed: Nov. 2, 2007

(65) Prior Publication Data
US 2009/0117734 A1    May 7, 2009

(51) Int. Cl.
*H01L 21/302* (2006.01)
(52) U.S. Cl. ........................ 438/691; 438/690
(58) Field of Classification Search ................... 438/690, 438/691
See application file for complete search history.

(56) References Cited

U.S. PATENT DOCUMENTS

| | | | |
|---|---|---|---|
| 4,279,993 A | 7/1981 | Magers et al. | |
| 5,676,587 A | 10/1997 | Landers et al. | |
| 5,769,699 A | 6/1998 | Yu | |
| 6,157,078 A * | 12/2000 | Lansford | 257/734 |
| 6,217,416 B1 | 4/2001 | Kaufman et al. | |
| 6,276,996 B1 | 8/2001 | Chopra | |
| 2003/0082996 A1 * | 5/2003 | Fortin et al. | 451/8 |
| 2005/0079803 A1 | 4/2005 | Siddiqui et al. | |
| 2006/0214133 A1 * | 9/2006 | Yamashita | 252/186.1 |
| 2007/0072413 A1 * | 3/2007 | Choi et al. | 438/645 |
| 2008/0067679 A1 * | 3/2008 | Takagi et al. | 257/751 |

OTHER PUBLICATIONS

Material Safety Data Sheet, "Reilline 4140", Reilly Industries, Inc., Apr. 28, 2004, pp. 1-5.
Material Safety Data Sheet, "Waferox 5", Air Products and Chemicals, Inc., Nov. 5, 2004, 1 page.
Material Safety Data Sheet, "BT-33 Solution", Air Products and Chemicals, Inc., Nov. 12, 2004, 1 page.

* cited by examiner

*Primary Examiner* — Bradley K Smith

(57) ABSTRACT

A process of forming an electronic device can include providing a workpiece. The workpiece can include a substrate, an interlevel dielectric overlying the substrate, a refractory-metal-containing layer over the interlevel dielectric, and a first metal-containing layer over the refractory-metal-containing layer. The first metal-containing layer can include a metal element other than a refractory metal element. The process further includes polishing the first metal-containing layer and the refractory-metal-containing layer as a continuous action to expose the interlevel dielectric. In one embodiment, the metal element can include copper, nickel, or a noble metal. In another embodiment, polishing can be performed using a selectivity agent to reduce the amount of the interlevel dielectric removed.

16 Claims, 5 Drawing Sheets

PROCESSES FOR FORMING ELECTRONIC DEVICES INCLUDING POLISHING METAL-CONTAINING LAYERS

BACKGROUND

1. Field of the Disclosure

This disclosure relates to processes for forming electronic devices, and more particularly to, processes for forming electronic devices including polishing metal-containing layers.

2. Description of the Related Art

Polishing metal-containing layers in electronic devices, and particularly integrated circuits, can be difficult due to predictable and unpredictable complications, even when only mechanical parameters are changed. Many contact or via plug and interconnect schemes include titanium nitride as a barrier layer. In many electronic devices, contact or via plugs include tungsten, and interconnects include copper. Because tungsten and titanium are both refractory metal elements, the tungsten and titanium nitride can be polished using the same polishing pad and the same polishing slurry. Copper polishes differently from refractory metals. Thus, a polishing process that is tailored for polishing tungsten is not well suited for polishing copper.

FIGS. 1 and 2 illustrate that different polishing pads, different polishing slurries, or any combination thereof are used when polishing conductive layers in which copper overlies titanium nitride. FIG. 1 includes an illustration of a cross-sectional view of a portion of a workpiece 10 that includes an insulating layer 102 and a contact or via plug 104 that extends through the insulating layer 102. A patterned insulating layer 122 overlies the insulating layer 102 and includes an interconnect trench. A plurality of conductive layers overlie the patterned insulating layer 122 and lie within the interconnect trench. The conductive layers include a titanium nitride layer 144, a copper seed layer 146, and a plated copper layer 148.

FIG. 1 illustrates the workpiece 10 as the plated copper layer 148 is being polished using a polishing pad 166 and a polishing slurry 16 that includes a liquid medium 162 and abrasive particles 164. The polishing pad 166 and polishing slurry 16 are tailored for polishing copper within the copper seed layer 146 and the plated copper layer 148. The combination of the polishing pad 166 and polishing slurry 16 does a poor job at polishing the titanium nitride layer 144. Thus, a different polishing pad or a different slurry is used to remove the titanium nitride layer 144.

FIG. 2 illustrates the workpiece 10 as the titanium nitride layer 144 is being polished using a polishing pad 266 and a polishing slurry 26 that includes a liquid medium 262 and abrasive particles 264. The polishing pad 266 and polishing slurry 26 are tailored for polishing the titanium nitride layer 144. The polishing pad 266, the liquid medium 262, the abrasive particles 264, another part of the polishing slurry 26, or any combination thereof is different from its corresponding item as illustrated in FIG. 1 (e.g., the polishing slurry 26 is different from the polishing slurry 16). The workpiece 10 may need to be moved from one polishing platen to a different polishing platen to remove the conductive layers lying outside the interconnect trench. Thus, the polishing process is discontinuous because a different polishing pad or a different polishing slurry causes a significant delay between the time the copper polishing is completed and the titanium nitride polishing begins. This delay affects the equipment throughput, the polishing sequence may require special handling (e.g., keep the workpiece wet so that abrasive particles do not dry onto the surface of the workpiece 10), may cause another complicating factor, or any combination thereof.

Therefore, skilled artisans have had to choose between using (1) the same polishing pad and polishing slurry that works well for one material (e.g., copper) and not another (e.g., titanium nitride) or (2) use different polishing pads, different polishing slurries, or any combination thereof, wherein each polishing pad, each polishing slurry, or each combination of polishing pad and polishing slurry is tailored to remove a particular material, but not all materials, within the plurality of conductive layers that form an interconnect.

BRIEF DESCRIPTION OF THE DRAWINGS

The present disclosure may be better understood, and its numerous features and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A plurality of different conductive layers can be polished with improved selectivity to an underlying interlevel dielectric ("ILD"), such as an oxide layer within the interlevel dielectric. The different conductive layers can have metal elements with significantly different properties. For example, one or more of the conductive layers can include a refractory metal element, and a different one or more of the conductive layers can include a metal element that is not a refractory metal element. As used herein, a refractory metal element is a metal element having a melting point of at least 1400° C. In a particular embodiment, one of the layers can include copper, nickel, a noble metal, or any combination thereof, and another layer can include a refractory metal nitride, a refractory metal silicon nitride, or any combination thereof. A selectivity agent can be added to a polishing fluid, such that the removal or scratching of an underlying interlevel dielectric is significantly reduced. Thus, problems associated with moving workpieces between different polishing pads or using different polishing slurries to remove the conductive layers can be avoided. Further, problems associated with a nonselective polish, e.g., removing too much of the interlevel dielectric or scratching the interlevel dielectric), can be significantly reduced.

In one aspect, a process of forming an electronic device can include providing a workpiece. The workpiece can include a substrate, an interlevel dielectric overlying the substrate, a refractory-metal-containing layer over the interlevel dielectric, and a first metal-containing layer over the refractory-metal-containing layer. The first metal-containing layer can include a metal element other than a refractory metal element. The process further includes polishing the first metal-containing layer and the refractory-metal-containing layer as a continuous action to expose the interlevel dielectric.

Attention is now directed to processes of forming an electronic device that includes polishing dissimilar conductive layers over an interlevel dielectric. The information herein is provided to aid in understanding particular details, and is not to limit the present invention.

Figure 1:
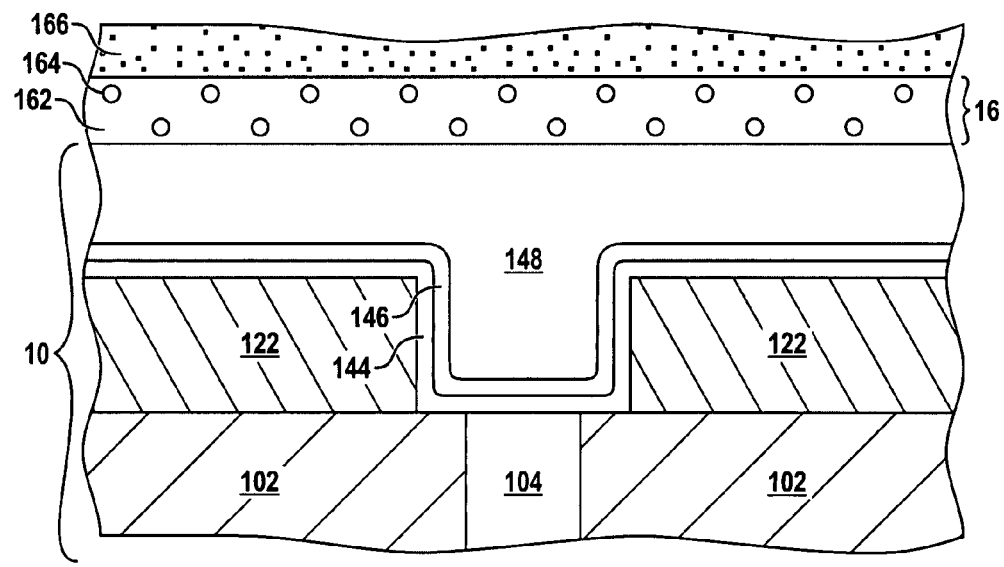
FIG. 1 includes an illustration of a cross-sectional view of a portion of a workpiece during polishing of a copper layer. (Prior art)
Figure 2:
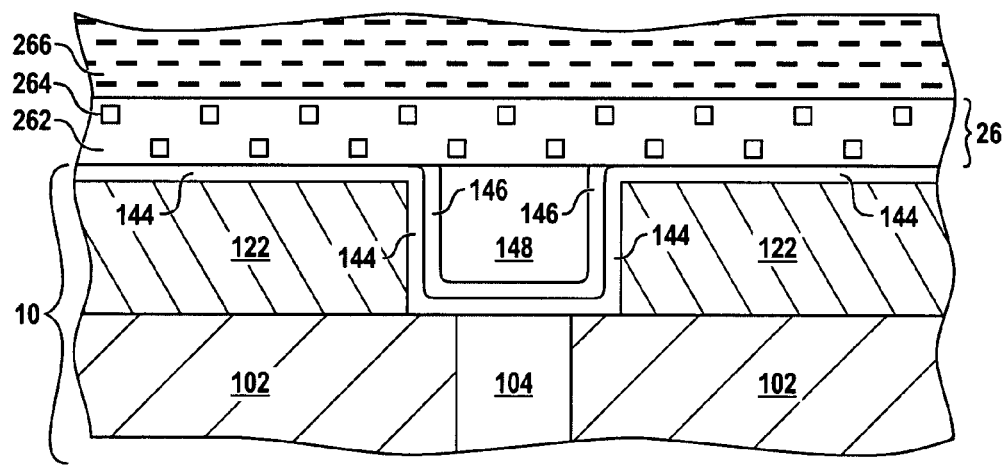
FIG. 2 includes an illustration of a cross-sectional view of the workpiece of FIG. 1 during polishing of a titanium nitride layer. (Prior art)
Figure 3:
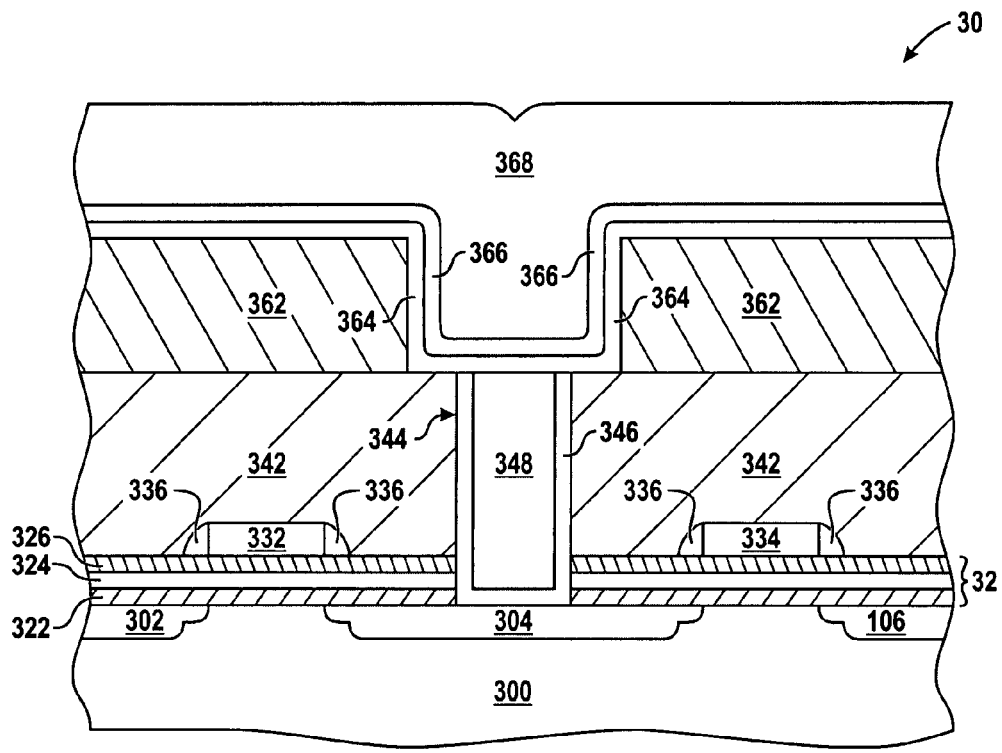
FIG. 3 includes an illustration of a cross-sectional view of a portion of a workpiece after forming conductive layers for an interconnect.

FIG. 3 includes an illustration of a cross-sectional view of a portion of a workpiece 30 that includes a substrate 300. The substrate 300 can include a monocrystalline semiconductor wafer, a semiconductor-on-insulator wafer, a flat panel display (e.g., a silicon layer over a glass plate), or other substrate used to form electronic devices. A charge storage stack 32 is formed over the substrate 300. The charge storage stack 32 can include an oxide layer 322, a charge storage layer 324, and another oxide layer 326. In one particular embodiment, the charge storage layer 324 can include a nitride layer, a doped silicon layer, or another suitable layer capable of storing a charge. In the particular embodiment as illustrated in FIG. 3, the charge storage layer 324 includes a nitride layer.

Gate electrodes 332 and 334 are formed over the charge storage stack 320. In a particular embodiment, the gate electrodes 332 and 334 are parts of different word lines for memory cells within the memory array. The gate electrodes 332 and 334 can include doped silicon, a metal, a metal nitride, another suitable gate electrode material, or any combination thereof. Spacers 336 are formed adjacent to the sides of the gate electrodes 332 and 334. Source/drain regions 302, 304, and 306 are formed within the substrate 300 after forming the gate electrodes 332 and 334. Portions of the gate electrodes 332 and 334 and regions within the substrate (e.g., source/drain regions 302, 304, and 306) can be silicided, if needed or desired. The silicide can include $TiSi_2$, $TaSi_2$, $CoSi_2$, or the like.

The workpiece 30 also includes an interlevel dielectric ("ILD") 342 and a conductive structure 344 that extends through the ILD 342. The ILD 342 overlies the gate electrodes 332 and 334 and the charge storage stack 32. The ILD 342 can include an oxide, a nitride, an oxynitride, or any combination thereof. The ILD 342 can include a single film or may include a plurality of films. The conductive structure 344 can include a conductive plug, such as a contact plug or a via plug, an interconnect, another suitable structure for routing a voltage or other signal, or any combination thereof. In the particular embodiment illustrated in FIG. 3, the conductive plug 334 is a contact plug that is electrically connected to the source/drain region 304. The conductive structure 344 can include a single film or a plurality of films. In one particular embodiment illustrated in FIG. 3, the conductive structure 344 includes a barrier layer 346 and a conductive fill layer 348, such as tungsten, polysilicon, or the like. The conductive structure 344 may or may not include an adhesion layer that would like between the ILD 342 and the barrier layer 346.

FIG. 3 includes an illustration of a cross-sectional view of the workpiece after forming another ILD 362. The ILD 362 overlies the ILD 342 and can include an oxide, a nitride, an oxynitride, or any combination thereof. In one embodiment, the uppermost layer of the ILD 362 can be an oxide layer. The ILD 342 can include a single film or may include a plurality of films. The ILD 362 is patterned to define an opening where a subsequently-formed interconnect will be electrically connected to the conductive structure 34 and the source/drain region 304. In the embodiment illustrated in FIG. 3, the opening is an interconnect trench.

The workpiece 30, up to an including formation of the openings in the ILD 342, is formed using conventional or proprietary techniques. Such techniques can include film growth, film deposition, etching, polishing, ion implantation, silicide reaction, or any combination thereof.

In the embodiment illustrated in FIG. 3, a plurality of conductive layers are formed over the ILD 362 and within the interconnect trench. At least one of the materials within the conductive layers is significantly from another material. In one embodiment, the conductive layers can include a barrier layer 364, a seed layer 366, and a conductive fill layer 368.

The barrier layer 364 is formed over the ILD 342 and within the opening extending therethrough. The barrier layer 364 has a composition and thickness sufficient to keep a material from a subsequently-formed conductive layer from migrating into the ILD 342, 362, or both. The barrier layer 364 can include a refractory-metal-containing material, such as a refractory metal nitride layer, a refractory metal semiconductor nitride layer, or a combination thereof. In one embodiment, the barrier layer can include TiN, TaN, TiSiN, TaSiN, another suitable conductive nitrogen-containing material, or any combination thereof. The barrier layer 364 can include a single film or more than one film. In one embodiment, the barrier layer 364 can include an adhesion film in addition to the nitrogen-containing film. The adhesion film lies between the insulating layer 36 and a nitrogen-containing film to reduce the likelihood that a nitrogen-containing film will delaminate from the insulating layer 362. In one embodiment, the barrier layer 364 has a thickness no greater than 90 nm, no greater than 50 nm, or no greater than 30 nm, and in another embodiment, the barrier layer 364 has a thickness at least 2 nm, at least 11 nm, or at least 20 nm. In still another embodiment, the barrier layer 364 can be thicker or thinner than those thicknesses. The barrier layer 364 can be formed by a conventional or proprietary technique. In one embodiment, the barrier layer 364 can be formed by physical vapor deposition, such as sputtering.

A seed layer 366 is deposited over the barrier layer 364. The seed layer 366 includes a conductive layer that promotes plating onto the workpiece 40. The seed layer 366 typically includes the same material that will be subsequently deposited. For example, if copper is to be deposited, the seed layer 366 can include copper. In another embodiment, the seed layer 366 can have a composition dissimilar to the material that will subsequently be deposited. The thickness of the seed layer 366 is sufficient to cover all surfaces of the barrier layer 364. In one embodiment, the seed layer 366 has a thickness no greater than 90 nm, no greater than 50 nm, or no greater than 30 nm, and in another embodiment, the seed layer 366 has a thickness at least 2 nm, at least 11 nm, or at least 20 nm. In still another embodiment, the seed layer 366 can be thicker or thinner than those thicknesses. The seed layer 366 can be formed by a conventional or proprietary technique. In one embodiment, the seed layer 366 can be formed by physical vapor deposition, such as sputtering or evaporation.

The barrier layer 364 and the seed layer 366 have a combined thickness that only partly, and not completely, fills the opening within the ILD 362. In one embodiment, the combined thickness is no greater than 90 nm, no greater than 50 nm, or no greater than 30 nm, and in another embodiment, the combined thickness 46 is at least 4 nm, at least 11 nm, or at least 20 nm. In still another embodiment, the combined thickness can be thicker or thinner than those previously described.

The conductive fill layer 368 fills the remaining portion of the opening in the ILD 362. The conductive fill layer 368 can include a metal, such as copper, nickel, a noble metal (gold, silver, platinum, palladium, osmium, or iridium), or another suitable metal. In a particular embodiment, the conductive fill layer 368 is mostly a single element, e.g., copper. In one embodiment, the conductive fill material 368 has a thickness no greater than 2000 nm, no greater than 1500 nm, or no greater than 900 nm, and in another embodiment, the conductive fill layer 368 has a thickness at least 110 nm, at least 300 nm, or at least 500 nm. In still another embodiment, the conductive fill layer 368 can be thicker or thinner than those thicknesses. The conductive fill layer 368 can be formed using a conventional or proprietary plating or vapor deposition technique. The exposed surface of the conductive fill layer 368 can be planar or can be undulating.

In one particular embodiment, the barrier layer 364 includes titanium nitride, and the seed layer 366 and the conductive fill layer 368 include copper. After reading this specification, skilled artisans will appreciate that many different combinations of materials of the previously listed materials can be used.

A polishing fluid and a polishing pad will be used to polish the conductive layers to form an interconnect. Details regarding the polishing fluid and the polishing pad are addressed before describing details during polishing.

The polishing fluid can include an oxidizing agent, a corrosion inhibitor, a buffer, a surfactant, a selectivity agent, an abrasive, or any combination thereof. The oxidizing agent can include an ammonium compound, a nitrate compound, another suitable oxidizer, or any combination thereof. In one embodiment, the oxidizing agent can include ferric nitrate, hydrogen peroxide, ammonium persulfate, ammonium molybdate, nitric acid, potassium iodate, potassium nitrate, or any combination thereof. The corrosion inhibitor can include an azole, such as benzotriazole, mercaptabenzothiazole or tolytriazole; an amine, such as methylamine or diethylamine; a ring compound, such as pyridine, quinoline, or dicyclohexamine nitrite; another suitable corrosion inhibiting compounds, such as potassium silicate, ammonium borate, ammonium phosphate or potassium dichromate; or any combination thereof.

The buffer can include potassium hydrogen phthalate, ammonium phosphate, ammonium acetate, ammonium dihydrogen phosphate, diammonium hydrogen phosphate, dibasic ammonium citrate, ammonium hydrogen phosphate, tribasic ammonium citrate, ammonium oxalate, ammonium carbamate, ammonium hydroxide, or any combination thereof. The surfactant can include polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, or any combination thereof.

The selectivity agent can help improve the polishing selectivity of each of the conductive layers to the ILD 362, which in one embodiment includes an oxide at the uppermost surface of the ILD 362. The selectivity agent can include a heteroaromatic compound. In one embodiment, the selectivity agent can include a polypryidine, a polypyrrole, a polythiophene, a polyfuran, another suitable heteroaromatic polymer, or any combination thereof. An exemplary selectivity agent can include:

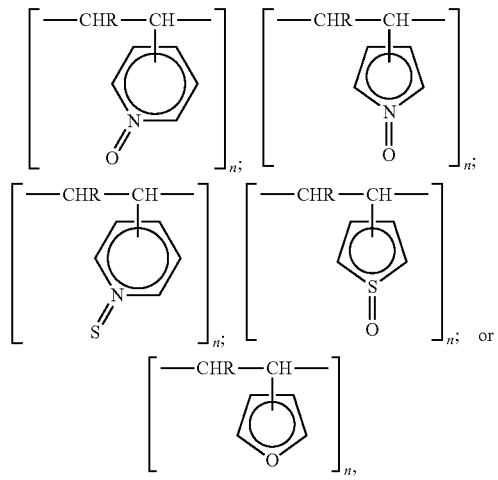

wherein:

R is —H, —$CH_3$, —$C_2H_5$, —$C_3H_7$, —$OCH_3$, —$OC_2H_5$, —$OC_3H_7$, —$OCOCH_3$, —$OCOC_2H_5$, or —$OCOC_3H_7$, the —CH— group in any of the formulas above is attached to any appropriate position on the aromatic ring; and n is greater than 1 but not so high that the polymer is insoluble within the polishing fluid. In a particular embodiment, the selectivity agent comprises poly(4-ethylpyridine-1-oxide).

Figure 4:
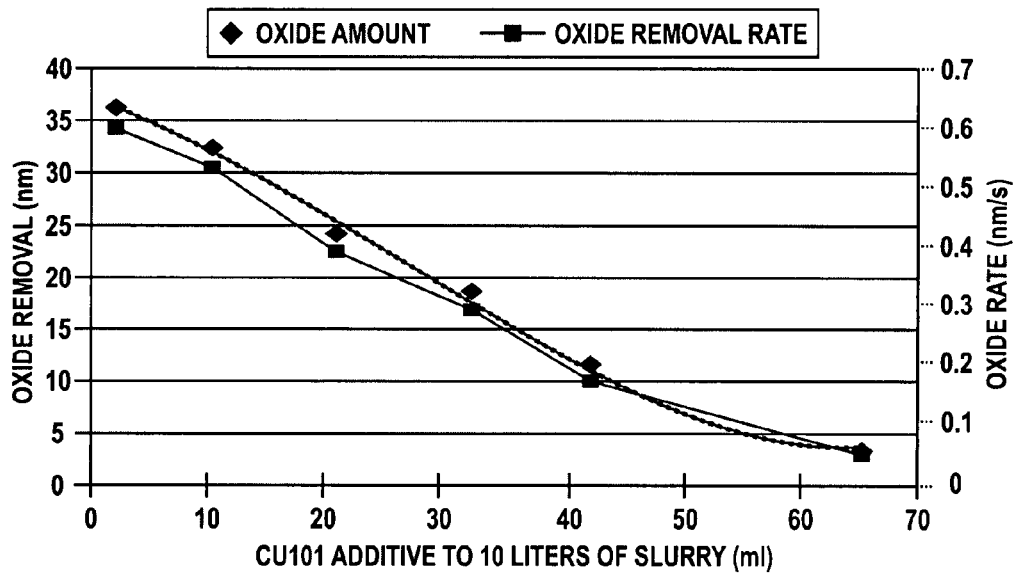
FIG. 4 includes a plot of oxide removal rate as a function of a concentration of a selectivity agent within a polishing fluid.

FIG. 4 includes a plot of oxide removed as a function of the concentration of the selectivity agent within the polishing fluid. Referring to FIG. 4, at lower concentrations of the selectivity agent within the polishing fluid, the removal rate significantly decreases within an increasing concentration of the selectivity agent. After the concentration reaches a certain point, a further increase in the concentration only slightly decreases the removal rate. Thus, beyond a particular concentration, any further increase in the concentration of the selectivity agent may not be needed or desired. In one embodiment, the selectivity agent can include CU101™-brand formulation from E. I. DuPont de Nemours & Co. of Wilmington, Del., U.S.A. or REILLINE 4140™-brand formulation from Reilly Industries of Indianapolis, Ind., U.S.A., each of which is believed to include approximately 40 wt % poly-4-vinylpyridine-N-oxide. The concentration of selectivity agent (e.g., CU101™-brand formulation) within the polishing fluid is at least approximately 0.25 weight percent or at least approximately 0.40 weight percent, and in another embodiment, the concentration is no greater than approximately 0.70 weight percent or no greater than approximately 0.95 weight percent.

Abrasives may be part of the polishing fluid or may be embedded within the polishing pad. The abrasives can include silica, ceria, alumina, or any combination thereof. In a particular embodiment, when abrasives are within the polishing fluid before reaching the polishing pad, the polishing fluid is a polishing slurry.

The polishing pad can include a polymeric compound, such as polyurethane, polyester, another suitable polymer, or any combination thereof. The polishing pad can include a single layer or a plurality of layers. In one particular embodiment, the polishing surface (i.e., the surface that will contact workpieces during polishing) can include a polyurethane layer, and polyester can be used as a backing layer. The polishing pad can have pores that formed when forming the polishing pad or a particular layer within the polishing pad.

The polishing surface may be patterned or unpatterned. Holes or other features may be drilled, cut, or otherwise formed into the polishing surface. The holes or other features may extend partly or completely through a particular within the polishing pad or through the entire thickness of the polishing pad.

In a particular embodiment, the polishing fluid includes hydrogen peroxide as the oxidizing agent, BT-33™-brand solution from Air Products and Chemicals, Inc. of Allentown, Pa., U.S.A. as the corrosion inhibitor, WAFEROX 5™-brand solution from Air Products and Chemicals, Inc. of Allentown, Pa., U.S.A. as the buffer, CU101™-brand formation as the selectivity agent, and silica as the abrasive. The pH of the polishing fluid is in a range of approximately 5 to approximately 8. The polishing pad includes polyurethane along the polishing surface. After reading this specification, skilled artisans will appreciate that another composition of the polishing fluid, a different range of pH, a different polishing pad, or any combination thereof can be used for their particular composition of layers 364, 366, and 368, or to meet their particular needs or desires.

Figure 5:
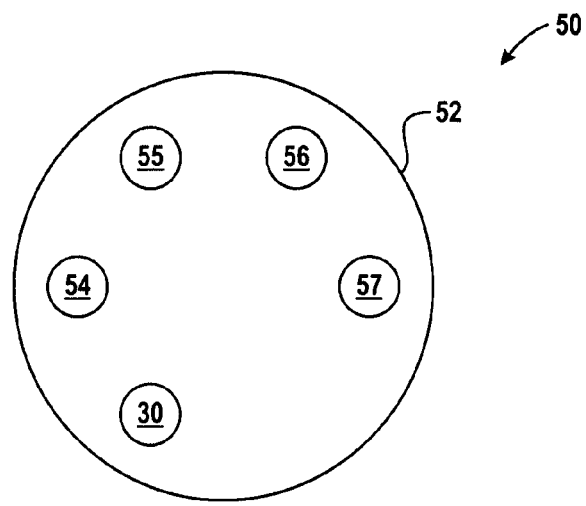
FIG. 5 includes an illustration of top view of a polishing pad and workpieces overlying a polishing pad.

The workpiece 30 and potentially other workpieces are placed into a polishing tool. In one embodiment, the polishing tool may be capable of polishing one, two, five, or a different number of workpieces at a time. FIG. 5 includes an illustration of a top view of a portion of a polishing tool 50. The polishing tool 50 includes a polishing pad 52 that can include any of the polishing pads previously described. Five workpieces 30, 54, 55, 56, and 57 are placed over the polishing pad 52 and held in placed by a chuck or other workpiece holder (not illustrated). The workpiece 30 has been previously described. In one embodiment, the workpieces 54 to 57 are substantially identical to the workpiece 30. Thus, the material to be polished (e.g., the conductive fill layer 368) will be in contact with the polishing pad 52 during polishing.

Figure 6:
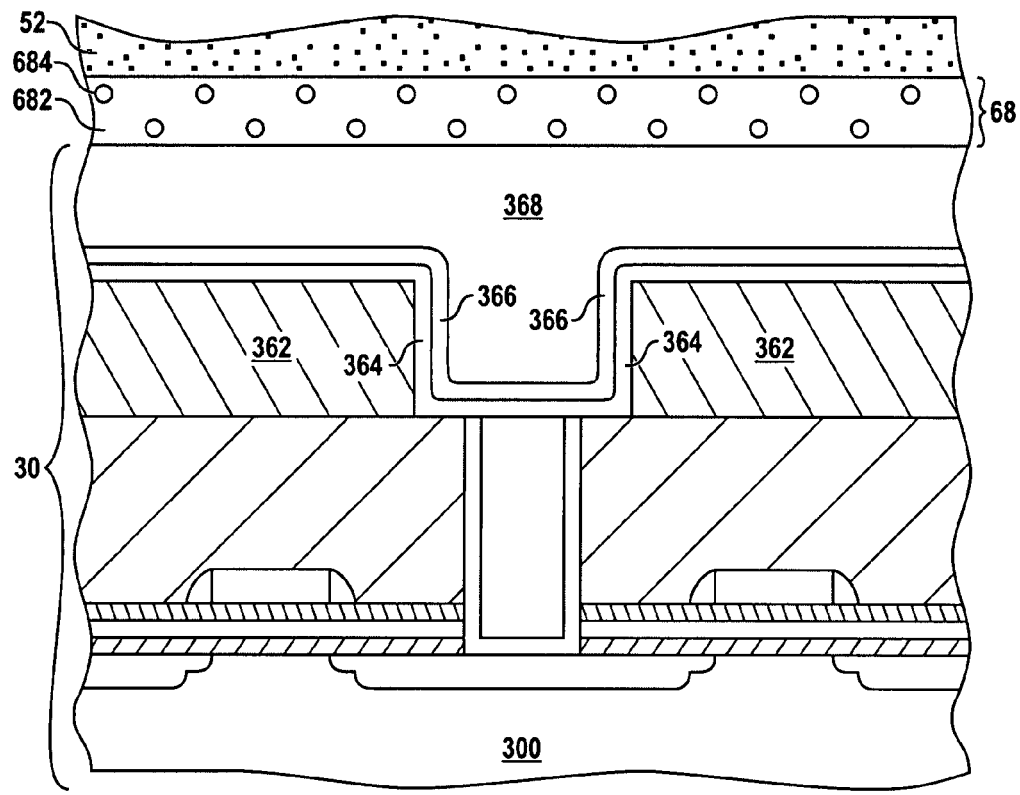
FIG. 6 includes an illustration of a cross-sectional view of the workpiece of FIG. 3 during polishing of a conductive fill layer.

FIG. 6 includes an illustration of a cross-sectional view of the workpiece 30 during polishing the conductive fill layer 368. During polishing, the orientation of the polishing pad 52 with respect to the workpiece 30 is reversed compared to what is illustrated in FIG. 6. In other words, the polishing pad 52 underlies the workpiece 30, and the conductive fill layer 368 would be closer to the floor of the fabrication facility than the substrate 300. The orientation used in FIG. 6 was selected to improve understanding of the concepts described herein.

Figure 7:
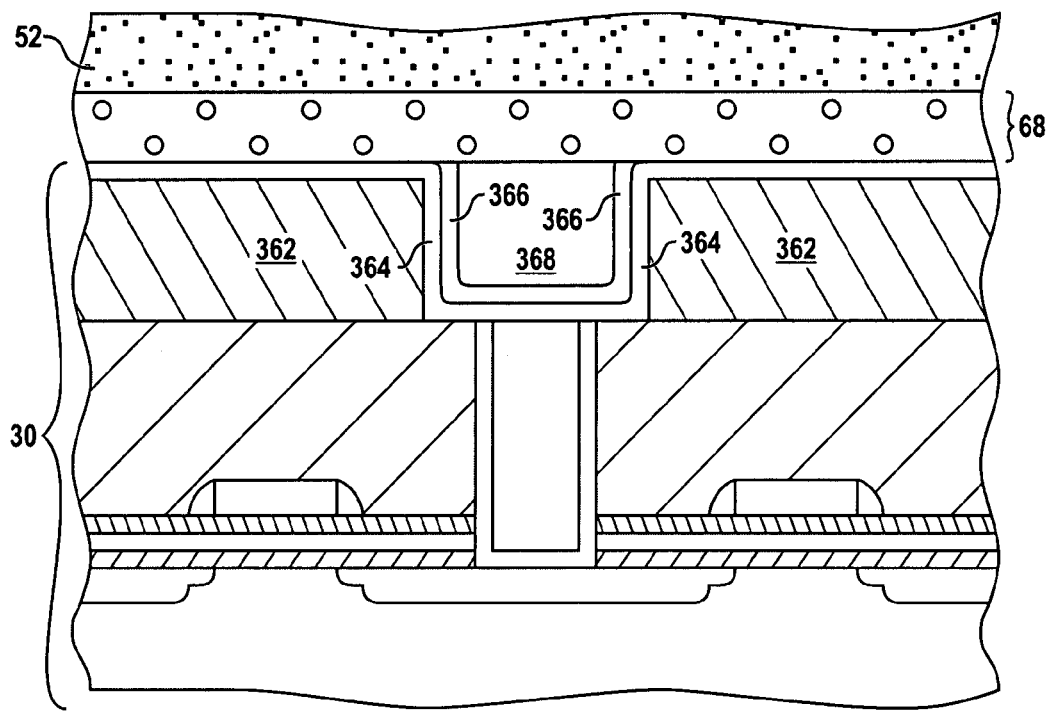
FIG. 7 includes an illustration of a cross-sectional view of the workpiece of FIG. 6 during polishing of a barrier layer.

FIG. 6 includes an illustration during polishing the conductive fill layer 368, and FIG. 7 includes an illustration during polishing the barrier layer 364. In a particular embodiment, the portions of the conductive fill layer 368, the seed layer 366, and the barrier layer 364 are removed as a continuous action to expose the ILD 362. As used herein, continuous action is intended to mean that there is no significant time delay between polishing any two immediately adjacent layers within the plurality of conductive layers. In one embodiment, the time delay is less than 5 seconds, less than 2 seconds, or even less than 1 second. In a particular embodiment, the same polishing pad 52 and the same polishing fluid 68 is used to polish the conductive fill layer 368, the seed layer 386, and the barrier layer 364, and thus, time delays and added complexity associated with moving the workpiece 30 from one polishing pad to another or with flushing the existing polishing fluid out of a dispense line and refilling the dispense line with a new polishing fluid can be avoided.

One or more polishing operating variables (e.g., platen rotational speed, substrate holder rotational speed, oscillating speed or distance, downforce pressure, or the like) may be changed during polishing of any particular layer or after polishing any particular layer and before finishing polishing the next adjacent layer. Any of the operating variables can be changed simultaneously or by ramping up or down the value of the particular operating variable.

The polishing can be performed for a fixed time without endpoint detection, until an endpoint is detected, or for a fixed or fractional time after end point detection. When a fixed time without an endpoint is used, prior workpieces with similar layers may be processed to provide an average polishing time to reach the underlying ILD. The fixed time may be an additional time above the average polishing time or an additional fraction of the average polishing time (e.g., 1.1, 1.5, 2.0 or other value times the average polishing time). Regardless whether the methodology used to determine the fixed time when endpoint is not used, the fixed time can be less than 15 minutes, less than 9 minutes, less than 7 minutes, or lower. The fixed time can be at least 1 minute, at least 2 minutes, at least 3 minutes, or higher.

In another embodiment, the endpoint can be used and monitored by determining the friction between the exposed surface of the workpiece 30 and the polishing pad 52. In one embodiment, the current used to drive the workpiece holder for a particular rotational speed can be used as the monitor. After an initial time period, a controller (hardware, firmware, software, or any combination thereof) can monitor current and time. The initial time period can be less than 2 minutes, less than 1 minute, or less than a half minute. When a significant decrease in current occurs between two different measurement times after the initial time period, the controller may determine that an endpoint has been reach. When more than one workpiece is being polishing on the same polishing pad, the controller may determine that the polishing endpoint occurs when one, some, or all of the workpieces have reached their corresponding endpoints.

An overpolish is not required; however, an overpolish may be used to take into account variations in thickness of layers or polishing rates across a workpiece or between workpieces being polished. In one embodiment, an overpolish can be a set time or a fraction of the time elapsed between the beginning of polishing and when the endpoint as detected by the controller is reached. In one embodiment, the overpolish can be at least 0.2 minutes, at least 1 minute or at least two minutes, and in another embodiment, the overpolish can be no greater than 5 minutes, no greater than 4 minutes, or no greater than 3 minutes. In one embodiment when a fraction of the time elapsed between the beginning of polishing and when the endpoint as detected is used for the overpolish, the fraction can be at least 2 percent, at least 10 percent or at least 20 percent, and in another embodiment, the fraction is no greater than 90 percent, no greater than 70 percent, or no greater than 50 percent.

Figure 8:
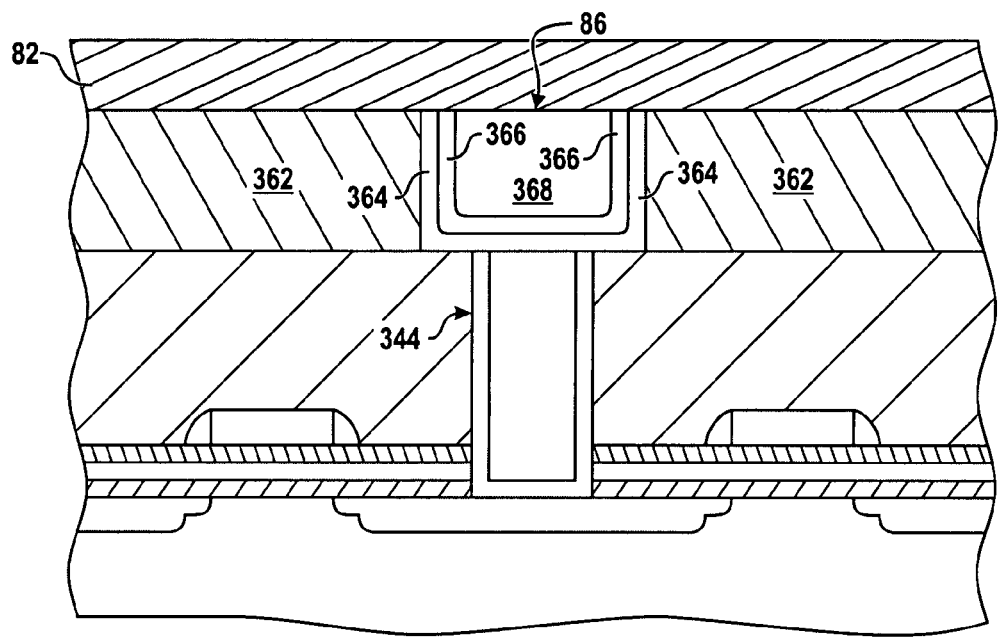
FIG. 8 includes an illustration of a cross-sectional view of the workpiece of FIG. 7 after forming a substantially completed electronic device.

FIG. 8 includes an illustration of a cross-sectional view of a substantially completed electronic device. A conductive structure 86 has been formed as a result of polishing the barrier layer 364, the seed layer 366, and the conductive fill layer 386, such that substantially none of those layers overlies the ILD 362. The conductive structure 86 is electrically connected to the conductive structure 344. In this embodiment, the conductive structure 86 is a single-inlaid structure.

Although not illustrated an additional ILD and interconnects at another level may be formed if needed or desired. After forming all of the ILDs and interconnect levels, an encapsulating layer 82 is then formed over the interconnects, including the interconnect 86. The encapsulating layer 82 can include a single film or a plurality of films. The encapsulating layer 82 can include an inorganic material, such as a silicon oxide, a silicon nitride, a silicon oxynitride, or any combination thereof. The encapsulating layer 82 can include a conventional or proprietary composition and be formed using a conventional or proprietary deposition technique.

The concepts described above can be extended to other embodiments. For example, a dual-inlaid interconnect can be formed. In this embodiment, the ILD layers 342 and 362 would be deposited and then be patterned to from a dual-inlaid opening that has a shape similar to a combination of the shapes of openings as illustrated in FIG. 3. The barrier layer 364, the seed layer 366, and the conductive fill layer 368 would be serially formed within the dual-inlaid opening. The barrier layer 364 may contact the source/drain region 304, and therefore, the conductive plug 344 is not formed. After completely filling the dual-inlaid opening with the conductive fill layer 368, polishing using any of the embodiments previously described can be used to remove portions of the conductive fill layer 368, and seed layer 366, and the barrier layer 364 that overlie the ILD 362.

In another embodiment, the process can be used at another interconnect level. For example, the process can be used between different interconnect levels, rather than the first interconnect level over the component level (e.g., the level that includes transistors, resistors, capacitors, diodes, etc.). The process can be used for a variety of different electronic devices. The electronic device can include other memory cells (static random access memory cells, dynamic random access memory cells, magnetoresistive random access memory cells, or the like) in addition to or in place of the NVM cells. The process can also be used in logic applications, such as microprocessors, microcontrollers, digital signal processors, or integrated circuits with specialized cores (e.g., engine controllers, focus control circuits within digital cameras, etc.). After reading the specification, skilled artisans will appreciate that the process can be adapted for use in making a variety of different integrated circuits.

Figure 9:
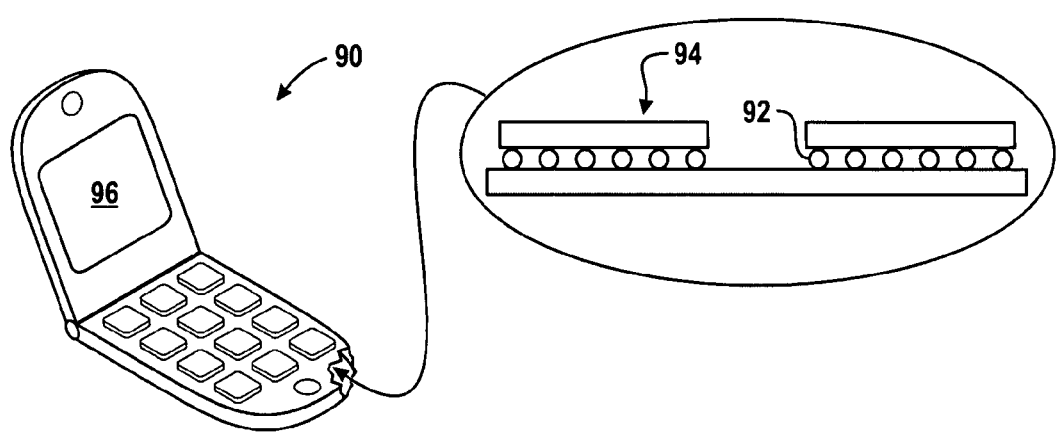
FIG. 9 includes an illustration of a cross sectional view of a system, wherein a processor is coupled to a display and an electronic device formed by a process described herein.

An electronic device formed using any one of the foregoing embodiments can be incorporated into a system, such as a system 90 as illustrated in FIG. 9. The system 90 includes the electronic device 92 formed by the process described herein. In one embodiment, the electronic device 92 can be an integrated circuit that includes NVM cells or other components or circuits that are sensitive to UV radiation where fabricating the electronic device 92. The electronic device 92 can be part of a standalone memory integrated circuit or may be part of a different type of integrated circuit.

The system 90 also includes a processor 94 is coupled to a display 96 and the electronic device 92. The processor 94 can include a central processing unit, a graphical processing unit, another suitable processing unit, or any combination thereof. The processor 94 may be part of a microcontroller, a microprocessor, a digital signal processor, another suitable data processing integrated circuit or the like. The processor 94 and the electronic device 92 can be separate integrated circuits mounted on the same printed wiring board or different printed wiring boards. In another embodiment, the processor 94 and the electronic device 92 may reside within the same integrated circuit. In one specific embodiment, the processor 94 can read data from the electronic device 92 and render or otherwise provide information to be displayed on the display 96 of the system 90.

Embodiments as described herein can allow for better control of a polishing sequence when a plurality of conductive layers having significantly different metal elements are present within the different layers. In one embodiment, a selectivity agent improves the polishing selectivity, such that conductive layers can be polished as a continuous action without removing too much of the underlying ILD. Compare the embodiments described herein to conventional embodiments, in which different polishing pads or polishing slurries are used (not a continuous action) or in which a less selective polishing process is used and removes too much of the ILD layer, causes scratches, or both. In a particular embodiment, the selectivity agent can be added such that the removal rate decreases but not so much that costs unnecessarily increase or a polishing complexity arises.

The embodiments can be performed with fixed times without endpoint detection or with endpoint detection that may or may not have an overpolish portion. The embodiments can be used at many different interconnect levels and for a variety of different electronic devices. The embodiments also allow for a wide variety of commonly deposited metals that overlie refractory-metal-containing layers to be polished with the refractory-metal-containing layers. Thus, after reading this specification, skilled artisans will understand how to modify an existing process to use the concepts described herein.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include providing a workpiece including a substrate, an interlevel dielectric overlying the substrate, a refractory-metal-containing layer over the interlevel dielectric, and a first metal-containing layer over the refractory-metal-containing layer, wherein the first metal-containing layer includes a metal element other than a refractory metal element. The process can also include polishing the first metal-containing layer and the refractory-metal-containing layer as a continuous action to expose the interlevel dielectric.

In one embodiment of the first aspect, the process further includes polishing the interlevel dielectric to remove no more than approximately 90 nm of the interlevel dielectric. In a particular embodiment, the interlevel dielectric includes an oxide layer at a surface in contact with the refractory-metal-containing layer. In a more particular embodiment, the refractory-metal-containing layer includes a refractory metal nitride, a refractory metal silicon nitride, or any combination thereof. In another embodiment, the first metal-containing layer includes a copper, nickel, a noble metal, or any combination thereof. In still another embodiment, the refractory-metal-containing layer includes tantalum nitride, tantalum silicon nitride, titanium nitride, titanium silicon nitride, or any combination thereof.

In a further embodiment of the first aspect, polishing the first metal-containing layer and the refractory-metal-containing layer is performed such that the workpiece remains in contact with a same polishing pad and using a same polishing fluid throughout polishing the first metal-containing layer and the refractory-metal-containing layer. In a particular embodiment, the process further includes polishing the interlevel dielectric such that the workpiece remains in contact with the same polishing pad and using the same polishing fluid. In a more particular embodiment, polishing the interlevel dielectric removes approximately 2 nm to approximately 4 nm of the interlevel dielectric.

In still a further embodiment of the first aspect, polishing the first metal-containing layer is performed using a selectivity agent, wherein the selectivity agent improves a selectivity of a removal rate of the first metal-containing layer to a removal rate of the interlevel dielectric. In a particular embodiment, the selectivity agent includes a heteroaromatic compound. In a more particular embodiment, polishing the first metal-containing layer is performed using a polishing fluid that includes the selectivity agent, wherein the selectivity agent is in a range of approximately 0.25 to approximately 0.95 weight percent of the polishing fluid. In an even more particular embodiment, the selectivity agent includes poly(4-ethylpyridine-1-oxide). In another more particular embodiment, the heteroaromatic compound includes a polypyrrole, a polythiophene, or a polyfuran.

In yet a further embodiment of the first aspect, the process further includes monitoring the polishing to detect an endpoint corresponding to when the refractory-metal-containing layer is removed. In a particular embodiment, monitoring includes detecting a significant reduction in friction that occurs after an initial delay period has expired.

In a second aspect, a process of forming an electronic device can include forming an oxide layer over a substrate, wherein the substrate includes a conductive region, patterning the oxide layer to define an opening exposing the conductive region, forming a barrier layer over the oxide layer and within the opening, wherein the barrier layer includes a refractory metal element, and forming a seed layer over the barrier layer, wherein the seed layer includes copper, and plating a copper-containing layer over the seed layer. The process can also include polishing the copper-containing layer, the seed layer, and the barrier layer to expose the oxide layer, wherein polishing the copper-containing layer, the seed layer, and the barrier layer and polishing the oxide layer is performed using a same polishing pad or a same polishing fluid. The process can further include polishing the oxide layer to remove no more than 20 nm of the oxide layer.

In one embodiment of the second aspect, polishing the copper-containing layer, the seed layer, and the barrier layer and polishing the oxide layer is performed using a same polishing pad and a same polishing fluid. In a particular embodiment, polishing the copper-containing layer, the seed layer, and the barrier layer and polishing the oxide layer is performed using a polishing fluid that includes a heteroaromatic polymer. In another embodiment, the process further includes monitoring the polishing the copper-containing layer, the seed layer, and the barrier layer to detect an endpoint corresponding to the barrier layer is removed, wherein detecting including determining that a significant reduction in friction occurs after an initial delay period has expired.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A process of forming an electronic device comprising:
   providing a workpiece comprising a substrate, an interlevel dielectric overlying the substrate, a refractory-metal-containing layer over the interlevel dielectric, and a first metal-containing layer over the refractory-metal-containing layer, wherein the first metal-containing layer includes a metal element other than a refractory metal element; and
   polishing the first metal-containing layer and the refractory-metal-containing layer as a continuous action to expose the interlevel dielectric, wherein:
      polishing the first metal-containing layer and the refractory-metal-containing layer is performed using a selectivity agent, wherein the selectivity agent improves a selectivity of a removal rate of the first metal-containing layer or the refractory-metal-containing layer to a removal rate of the interlevel dielectric; and
      the selectivity agent comprises a heteroaromatic polymer.

2. The process of claim 1, further comprising polishing the interlevel dielectric to remove no more than approximately 90 nm of the interlevel dielectric.

3. The process of claim 2, wherein the interlevel dielectric includes an oxide layer at a surface in contact with the refractory-metal-containing layer.

4. The process of claim 3, wherein the refractory-metal-containing layer comprises a refractory metal nitride, a refractory metal silicon nitride, or any combination thereof.

5. The process of claim 1, wherein the first metal-containing layer comprises a copper, nickel, a noble metal, or any combination thereof.

6. The process of claim 1, wherein the refractory-metal-containing layer comprises tantalum nitride, tantalum silicon nitride, titanium nitride, titanium silicon nitride, or any combination thereof.

7. The process of claim 1, wherein polishing the first metal-containing layer and the refractory-metal-containing layer is performed such that the workpiece remains in contact with a same polishing pad and using a same polishing fluid throughout polishing the first metal-containing layer and the refractory-metal-containing layer.

8. The process of claim 7, further comprising polishing the interlevel dielectric such that the workpiece remains in contact with the same polishing pad and using the same polishing fluid.

9. The process of claim 8, wherein polishing the interlevel dielectric removes approximately 2 nm to approximately 4 nm of the interlevel dielectric.

10. The process of claim 1, wherein polishing the first metal-containing layer is performed using a polishing fluid that includes the selectivity agent, wherein the selectivity agent is in a range of approximately 0.25 to approximately 0.95 weight percent of the polishing fluid.

11. The process of claim 1, wherein the refractory-metal-containing layer comprises a refractory metal nitride, a refractory metal silicon nitride, or any combination thereof, and the selectivity agent improves the selectivity of the removal rate of the refractory-metal-containing layer to the removal rate of the interlevel dielectric.

12. The process of claim 1, further comprising monitoring the polishing to detect an endpoint corresponding to when the refractory-metal-containing layer is removed.

13. The process of claim 12, wherein monitoring comprises detecting a significant reduction in friction that occurs after an initial delay period has expired.

14. A process of forming an electronic device comprising:
providing a workpiece comprising a substrate, an interlevel dielectric overlying the substrate, a refractory-metal-containing layer over the interlevel dielectric, and a first metal-containing layer over the refractory-metal-containing layer, wherein the first metal-containing layer includes a metal element other than a refractory metal element; and
polishing the first metal-containing layer and the refractory-metal-containing layer as a continuous action to expose the interlevel dielectric, wherein:
 polishing the first metal-containing layer is performed using a selectivity agent, wherein the selectivity agent improves a selectivity of a removal rate of the first metal-containing layer to a removal rate of the interlevel dielectric; and
 the selectivity agent comprises a polypyrrole, a polythiophene, a polyfuran, or poly(4-ethylpyridine-1-oxide).

15. A process of forming an electronic device comprising:
forming an oxide layer over a substrate, wherein the substrate includes a conductive region;
patterning the oxide layer to define an opening exposing the conductive region;
forming a barrier layer over the oxide layer and within the opening, wherein the barrier layer includes a refractory metal element;
forming a seed layer over the barrier layer, wherein the seed layer includes copper;
plating a copper-containing layer over the seed layer;
polishing the copper-containing layer, the seed layer, and the barrier layer to expose the oxide layer, wherein:
 polishing the copper-containing layer, the seed layer, and the barrier layer and polishing the oxide layer is performed using a same polishing pad or and a same polishing fluid;
 polishing is performed using a selectivity agent, wherein the selectivity agent improves a selectivity of a removal rate of the barrier layer to a removal rate of the oxide layer; and
 polishing the copper-containing layer, the seed layer, and the barrier layer and polishing the oxide layer is performed using a polishing fluid that includes a heteroaromatic polymer; and
polishing the oxide layer to remove no more than 20 nm of the oxide layer.

16. The process of claim 15, further comprising monitoring the polishing the copper-containing layer, the seed layer, and the barrier layer to detect an endpoint corresponding to the barrier layer is removed, wherein detecting comprising determining that a significant reduction in friction occurs after an initial delay period has expired.

* * * * *

UNITED STATES PATENT AND TRADEMARK OFFICE
CERTIFICATE OF CORRECTION

| | | |
|---|---|---|
| PATENT NO. | : 7,915,169 B2 | Page 1 of 1 |
| APPLICATION NO. | : 11/934628 | |
| DATED | : March 29, 2011 | |
| INVENTOR(S) | : Christopher Brannon et al. | |

It is certified that error appears in the above-identified patent and that said Letters Patent is hereby corrected as shown below:

Column 14, Line 11, please change "a same polishing pad or and a same polishing fluid" to
--a same polishing pad and a same polishing fluid--

Signed and Sealed this
Twenty-fifth Day of October, 2011

David J. Kappos
*Director of the United States Patent and Trademark Office*